BROADBAND PARAMETRIC AMPLIFIER WITH TWO INDEPENDENTLY TUNABLE IDLER CIRCUITS
Filed March 7, 1963
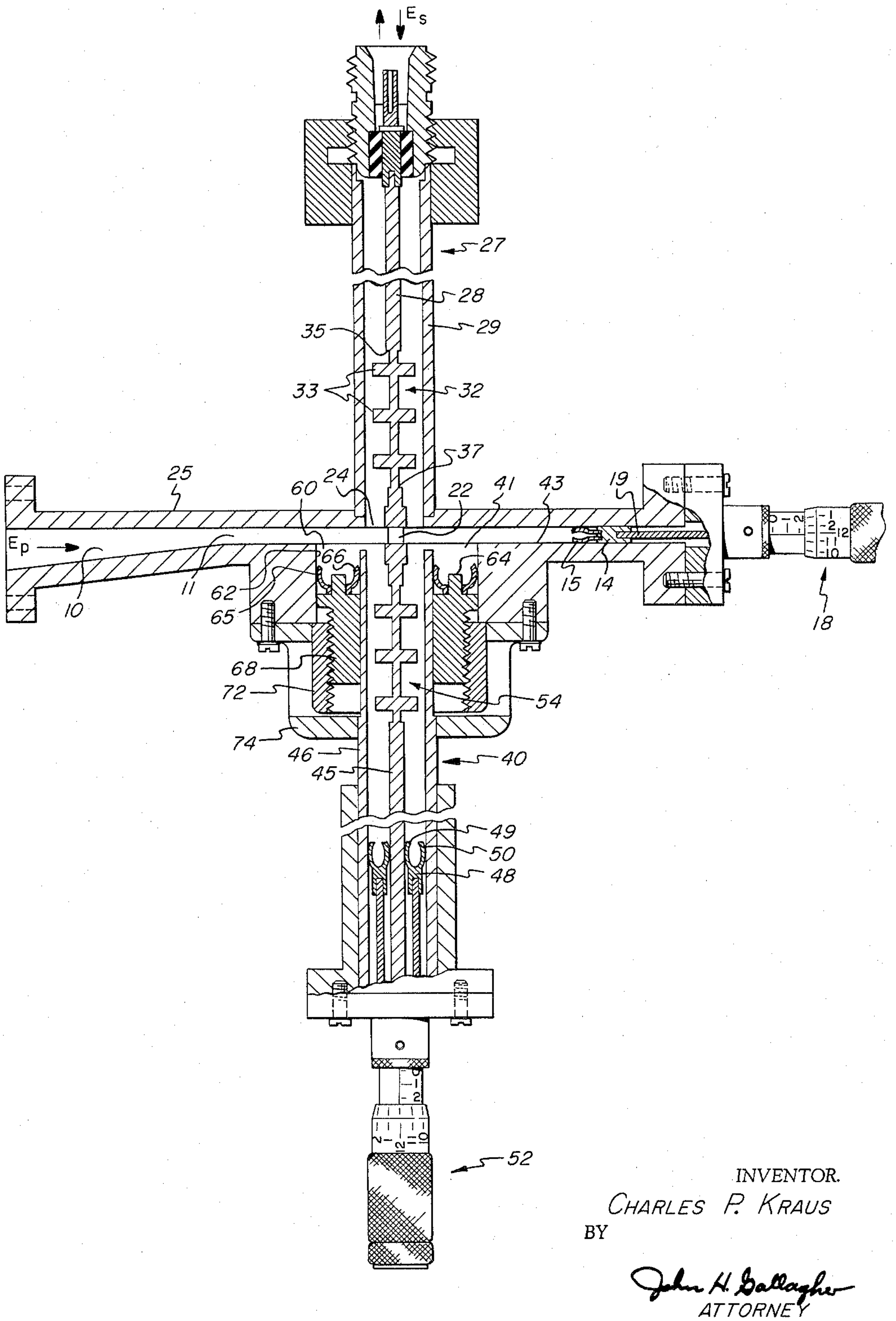
INVENTOR.
CHARLES P. KRAUS
BY
John H. Gallagher
ATTORNEY United States Patent Office 3,210,676

Patented Oct. 5, 1965

3,210,676
BROADBAND PARAMETRIC AMPLIFIER WITH TWO INDEPENDENTLY TUNABLE IDLER CIRCUITS

Charles P. Kraus, Glen Oaks, N.Y., assignor to Sperry Rand Corporation, Great Neck, N.Y., a corporation of Delaware Filed Mar. 7, 1963, Ser. No. 263,659
5 Claims. (Cl. 330—4.9)

The present invention relates to a non-degenerate parametric amplifier, and more particularly to a simple and compact structure for providing a double tuned idler frequency circuit, thereby to achieve a relatively broad operating frequency range for the amplifier.

In a non-degenerate parametric amplifier there are three frequencies of interest, the signal frequency $f_s$, the pump frequency $f_p$, and the idler frequency $f_i$, wherein the relationship between the frequencies is $f_p=f_s+f_i$, and $f_i$ is very much greater than $f_s$. The parametric amplifier of this invention utilizes a non-linear reactance element such as a variable-capacitance diode which has become known in the art as a varactor diode. Electrically, the diode is common to the pump, signal, and idler circuits, and in the device of this invention, the idler and signal circuits are comprised of reactively-terminated lengths of coaxial and uniconductor waveguides that reflect back to the diode respective values of reactances that resonate with the fixed reactance of the diode at the respective frequencies.

One of the attractive operating features of the non-degenerate parametric amplifier is its relatively low noise figure, and as is known, the larger the ratio of the idler frequency $f_i$ to the signal frequency $f_s$, the lower the noise figure. It is for this reason that the non-degenerate parametric amplifier is attractive, even though its bandwidth is more limited than the degenerate parametric amplifier. In the "straight-through" non-degenerate amplifier, the input and amplified output waves are at the same signal frequency that is lower than one-half the frequency of the pump waves. In the up-converter, the output waves are at the frequency of the idler waves which differ in frequency from the pump frequency waves by the frequency of the very much lower signal frequency waves.

Another important characteristic of the parametric amplifier is its gain-bandwidth product ($K_o^{1/2}B$) wherein $K_o$ is its gain and B is its bandwidth. For most applications it is desirable that the amplifier have a large bandwidth. An expression for the gain-bandwidth product is $$K_o^{1/2}B=\frac{2}{\frac{1}{B_s}+\frac{1}{B_i}}$$

wherein $B_s$ and $B_i$ are the bandwidths of the signal frequency circuit and the idler frequency circuit, respectively. In the present invention, the bandwidth of the amplifier is increased by increasing the bandwidth of the idler frequency circuit, and in particular, this bandwidth is increased by providing a uniquely arranged second idler frequency circuit which then permits independent double tuning of the idler frequency circuit.

In known prior art parametric amplifiers having a double tuned idler frequency circuit and constructed in rectangular uniconductor and coaxial waveguides, the addition of a second tuned idler circuit usually has resulted in one or both of the following undesirable features: The circuit has required the addition of appreciable physical structure in the way of size and weight, and/or the additional circuit was not tunable. The added size is undesirable because the parametric amplifier is used in the microwave section of a system where the packaging arrangement usually is compact and space is restricted, or the amplifier may be used in portable test equipment where the size and weight of the equipment must be kept as small as possible. If the second idler circuit is not independently tunable, the adjustment of the amplifier to obtain optimum performance becomes a lengthy and tedious task.

The parametric amplifier of this invention includes a second idler frequency circuit that is readily tunable and adds negligible physical structure and weight to the amplifier. The second idler frequency circuit of this invention is in the form of a cavity or resonator that utilizes a portion of the already existing signal frequency circuitry and adds independent tuning means for the second idler frequency circuit that has negligible effect on the signal frequency circuit, and adds negligible physical structure to the device.

Referring now to the accompanying drawing, the parametric amplifier of this invention is comprised of a section of uniconductor waveguide 10 having a rectangular cross section and being adapted to receive at its left end electromagnetic waves $E_p$ at a pump frequency. The height of the rectangular waveguide section 10 is gradually narrowed by means of a tapering section 11 so that the remaining portion is of a reduced height with respect to the input end. The right end of waveguide section 10 is short-circuited by means of a conductive block 14 and conductive spring contact fingers 15 which form a firm and slideable contact with the interior walls of waveguide section 10, in a well known manner. The axial position of conductive block 14 and spring contact fingers 15 may be adjusted by means of a micrometer screw mechanism 18 which connects to block 14 by means of a rod 19.

Disposed within the reduced-height portion of rectangular waveguide section 10 is a non-linear variable reactance device 22 which may be an electrically-controllable variable capacitance diode of the type known as a varactor diode. A varactor diode of the type MA4252, manufactured by Microwave Associates, Inc., Burlington, Massachusetts, has been used with success.

Extending-transversely from an aperture 24 in the top wall 25 of waveguide section 10 is a section of coaxial transmission line 27 having an inner conductor 28 and an outer conductor 29. Inner conductor 28 of coaxial section line 27 is connected to one terminal of varactor diode 22. Electromagnetic waves $E_s$ at a signal frequency are coupled into the opposite end of coaxial line section 27 and, in one embodiment of the invention known as a "straight-through" amplifier, the signal frequency waves also are coupled from the amplifier through coaxial line section 27. Included within coaxial line section 27 is a low pass filter 32 comprised of thin conductive discs 33 which are spaced along inner conductor 28. Coaxial line filters of this type are well known to those skilled in the art. Inner conductor 28 is of reduced diameter in the region 35–37 in order to provide high input impedance to varactor diode 22. The coaxial line filter 32 is constructed to freely pass electromagnetic waves $E_s$ at the signal frequency and to block electromagnetic waves $E_p$ at the pump frequency and waves $E_i$ at the idler frequency.

A second section of coaxial transmission line 40 extends transversely from an aperture 41 in the bottom broad wall 43 of waveguide section 10, and is comprised of inner conductor 45 and outer conductor 46. Inner conductor 45 is connected to the other terminal of diode 22. Coaxial line section 40 is terminated near its end by an adjustable short-circuiting means comprised of a conductive annulus 48 and spring contact fingers 49 and 50 that make sliding contacts with the inner and outer conductors 45 and 46, respectively. The position of the short circuit provided by annulus 48 and spring fingers 49 and 50 is axially adjustable by suitable means such as the micrometer screw mechanism 52. A second coaxial line filter 54 is positioned within coaxial line section 40 and is substantially identical in construction and performance to the earlier described filter 32.

Disposed concentrically about coaxial line section 40 is a coaxial line section 60 whose inner conductor is the outer conductor 46 of coaxial line section 40, and whose outer conductor 62 is the cylindrical surface of aperture 41 extending through the bottom wall 43 of waveguide section 10. Outer concentric coaxial line section 60 is terminated at its lower end by means of a short circuit provided by annular member 64 and spring contact fingers 65 and 66 which respectively engage the outer and inner conductors of said section. The short-circuiting means just described are secured to an axially-extending threaded member 68 which slideably engages outer conductor 46. A threaded nut 72 engages threaded member 68, and upon rotation of nut 72, threaded member 68, spring contact fingers 65 and 66 and the annular member 64 are axially moved toward or away from the end of coaxial line section 60. Threaded nut 72 is held within a housing member 74 which restrains nut 72 against axial movement but permits free rotation thereof.

It is known that varactor diode 22 may be characterized as having two reactance components. One component is the electrically-controllable time varying capacitive reactance, and the other component is the reactance that arises from its lead wires, from its package and caps, and from its presence within rectangular waveguide section 10. This second component will be referred to hereinafter as its fixed reactance in order to distinguish it from its non-linear reactive component which gives rise to the amplification process. In order for the varactor diode to operate efficiently, it is necessary that the fixed reactive component be substantially eliminated. Toward this end, conductive block 14 and spring contact fingers 15 within waveguide section 10 are positioned from varactor diode 22 by a distance so that the terminating reactance as transformed back to diode 22 by the intervening length of waveguide is of the proper value to resonate at the idler frequency with the fixed reactance of the diode, thereby substantially cancelling this component. Also, the position of the effective short-circuit in rectangular waveguide 10 is chosen to achieve sufficient coupling of the pump frequency waves to varactor diode 22. In a similar manner, the position of annulus 48 and spring contact fingers 49 and 50 in coaxial line section 40 are proportioned to reflect a reactance at diode 22 so as to resonate at the signal frequency with the fixed reactance of diode 22, thereby eliminating the effects of this reactance at the signal frequency.

Representative frequencies of the pumps, idler, and signal waves for a "straight-through" parametric amplifier constructed in accordance with this invention are as follows: pump frequency 10.5 kilomegacycles; idler frequency 10.065 kilomegacycles; signal frequency 435 megacycles. The amplifier operated satisfactorily over a signal frequency range of approximately 25 megacycles with a minimum of 14 db of gain.

In order to obtain efficient operation over a relatively wide frequency range, it is desirable to have a broadband idler frequency circuit. One way to obtain this broadband circuit is to provide a second tuned circuit so that the wider double-tuned response now may be obtained for the idler frequency signal.

In the parametric amplifier of this invention, the second idler frequency circuit includes the adjacent inner end portions of coaxial transmission section 27 and 40 that are bounded by the filters 32 and 54, and also includes the outer concentric coaxial transmission 60 which is an adjustable-length series line that functions to introduce a variable series reactance into the serially arranged sections of lines 27 and 40 that lie between filters 32 and 54.

The series reactance presented by concentric line section 60 may be expressed as $$Z_o \tan \frac{2\pi f L}{c}$$

wherein $Z_0$ and L, respectively, are the characteristic impedance and the electrical length of the concentric line section 60, $f$ is the frequency of the waves in the line, and $c$ is the free space propagation velocity of light. This arrangement provides effective tuning of the second idler frequency circuit but has negligible effect on the tuning of the signal frequency circuit despite the fact that the second idler frequency circuit and the signal frequency circuit share a common portion of the coaxial transmission lines 27 and 40. This results from the fact that the series reactance introduced by concentric line section 60 represents a negligibly small series inductance at the signal frequency, and therefore has negligible effect on the tuning of the signal frequency circuit. On the other hand, this series reactance represents a significant reactance at the idler frequency, and the value of this reactance is variable through a wide range sufficient to provide tuning of the second idler frequency circuit over a broad frequency range. The different effects of this series reactance at the signal and idler frequencies may be realized by referring to the above equation for the reactance of this concentric line section. The frequency $f_s$ of the signal waves is many times smaller than the frequency $f_i$ of the idler frequency waves, and the electrical length L of the concentric line section 60 is a negligible distance in terms of the signal frequency wavelength, but represents an appreciable distance in terms of the idler frequency wavelength.

In considering the tuning of the second idler frequency circuit, the values of the terminating reactances presented by filters 32 and 54 vary widely as a function of frequency and in a manner that is not always readily determinable beforehand from only design and theoretical considerations. The addition of the concentric line section 60, however, provides a variable series reactance that is readily adjusted to provide the proper reactance to tune the second idler frequency circuit so as to resonate with the fixed reactance of varactor diode 22 at the idler frequency, and this is so irrespective of the values of reactances presented by filters 32 and 54.

The addition of the concentric line section 60 therefor eliminates the requirement that the filters 32 and 54 be precisely positioned within coaxial lines sections 27 and 40 and also eliminates the necessity that the filters be precisely designed to present specific values of reactances. These are significant advantages in the manufacture and operation of a parametric amplifier. An amplifier constructed in accordance with the teachings of this invention also is less susceptible to permanent damage resulting from shock and vibration since a simple tuning adjustment of concentric line section 60, i.e., rotation of tuning nut 72, will quickly bring the amplifier back into optimum operation conditions. Furthermore, the amplifier is not sensitive to pump frequency changes. This feature has been experienced by using the same amplifier at a pump frequency of 10.5 and 9.8 kmc. In both cases a broad double tuned response was obtained. It thus may be seen that substantially independent tuning is provided for the second idler frequency circuit despite the fact that this circuit shares a common structure with the independently tunable signal frequency circuit. It is this feature which permits the addition of a second independently tunable idler frequency circuit without a corresponding appreciable increase in the physical structure of the amplifier.

The parametric amplifier constructed in accordance with this invention is readily adjustable in that optimum operating conditions may be achieved within a matter of several minutes after connecting a newly constructed amplifier in a circuit. This is a considerable improvement over known parametric amplifiers wherein a considerably longer length of time, involving continuous adjustment, often is required before proper operation could be achieved. I also have found that the replacement of the varactor diode does not create the serious disturbance to the operation of the amplifier as it does in other known parametric amplifiers. The fixed reactances of varactors vary widely, and the small change in positions and alignment that necessarily results when a diode is replaced by a new one are significant enough to lead to appreciable changes in the fixed reactance of the diodes. These changes often have required a complete returning of the amplifier each time a diode was replaced. The amplifier of this invention is not affected by these factors to the extent that others are.

In the above discussion the amplifier was described as the type known as a single port straight-through amplifier. The device of this invention also may be operated as an "up-converter" parametric amplifier. In this instance, the input waves at the signal frequency are coupled into the amplifier through coaxial transmission line 27, but the output waves are at the idler frequency and are coupled from the amplifier by means of uniconductor rectangular waveguide 10. In this instance, a circulator will be coupled to the input end of the rectangular waveguide section 10 so as to separate the input pump frequency waves from the output idler frequency waves. In the case of the straight-through amplifier, a circulator will be coupled to coaxial transmission line 27 so as to separate the input and output waves at the signal frequency.

It is to be understood that reactive terminating means other than conductive short circuits may be provided in the various uniconductor and coaxial waveguides, if desired.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. Electromagnetic wave apparatus comprising,
a first section of waveguide adapted to receive electromagnetic waves at a first frequency at one end and being adapted to support waves at said first frequency and waves at a second frequency but not waves at a third frequency which is much lower than the first and second frequencies,
a non-linear variable reactance device positioned within said waveguide,
said reactance device being characterized by having a substantially fixed component of reactance and a non-linear variable component of reactance at a given frequency,
reactive means associated with said first waveguide and presenting at said non-linear variable reactance device a value of reactance to resonate at said second frequency with the fixed component of reactance of said device,
a second section of waveguide coupled to said first section of waveguide and to said non-linear variable reactance device,
said second section of waveguide being adapted to receive electromagnetic waves at said third frequency for coupling to said non-linear variable reactance device,
third and fourth concentrically arranged waveguides coupled to said first section of waveguide and to said non-linear variable reactance device,
second reactive means associated with the inner one of said concentric waveguides to present at said device a value of reactance to resonate at said third frequency with the fixed component of reactance of said device, filter means associated with said second and said inner concentrically disposed waveguides for presenting reactances that permit the passage of said third frequency waves but block said first and second frequency waves,
third reactive means associated with the outer one of said concentrically arranged waveguides which together present to wave at said second frequency a reactance in series with the adjacent portions of said second and inner concentric waveguides bounded by said filter means,
said third reactive means and the outer one of said concentrically arranged waveguides having a substantially negligible effect on the resonance at said third frequency that is effected by said second reactive means, but presenting a series reactance at said second frequency that is proportioned with respect to the reactance of said filter means to resonate at said second frequency with the fixed component of reactance of said variable reactance device.

2. A non-degenerate parametric amplifier comprising,
a first section of waveguide adapted to receive pump frequency waves at one end and being adapted to support waves of said pump frequency and waves of an idler frequency but not waves of a signal frequency which is much lower than said idler frequency,
a non-linear variable reactance device positioned within said first waveguide intermediate its two ends,
said reactance device being characterized by having a substantially fixed component of reactance and a non-linear variable component of reactance at a given frequency,
means for reactively terminating said first waveguide at its opposite end at a distance from said device to present at said device a value of reactance to resonate at said idler frequency with the fixed component of reactance of said device,
a second section of waveguide coupled to said first section of waveguide and to said non-linear variable reactance device,
said second section of waveguide being adapted to receive signal frequency waves for coupling to said non-linear variable reactance device,
third and fourth concentrically arranged waveguides coupled to said first section of waveguide and to said non-linear variable reactance device,
means for reactively terminating said inner concentric waveguide at a distance from the reactance device to present at said device a value of reactance to resonate at said signal frequency with the fixed component of reactance of said device,
filter means positioned in said second and said inner concentrically disposed waveguides for presenting reactances that permit the passage of said signal frequency waves but block said idler frequency and said pump frequency waves,
means for terminating the outer concentrically arranged waveguide in a reactive termination to present to electromagnetic waves at the idler frequency reactance in series with said second and said inner concentric waveguides,
said outer concentrically arranged waveguide and its reactive termination having a substantially negligible effect on the resonance at said signal frequency that is effected by said reactively terminated inner waveguide, but presenting a series reactance at said idler frequency that is proportioned with respect to the reactances of said filter means to resonate at said idler frequency with the fixed component of reactance of said variable reactance device.

3. A tunable broadband non-degenerate parametric amplifier comprising, a section of uniconductor rectangular waveguide adapted to support electromagnetic waves at first and second frequencies and being cutoff to electromagnetic waves at a third frequency, one end of said rectangular waveguide being adapted to receive electromagnetic waves at said first frequency, non-linear variable reactance means positioned within said rectangular waveguide intermediate its two ends, said non-linear variable reactance means being characterized by having a fixed component of reactance and a non-linear variable component of reactance at a given frequency, adjustable reflective terminating means at the opposite end of said rectangular waveguide for providing at said reactance device a reactance to resonate at said second frequency with the fixed reactance of said device, a first TEM mode transmission line electromagnetically coupled at one end to said reactance device through one broad wall of said rectangular waveguide, the opposite end of said TEM mode transmission line being adapted to receive electromagnetic waves at said third frequency, second and third concentrically disposed and independently short-circuited TEM mode transmission lines coupled to said reactance device through the opposite broad wall of said rectangular waveguide, the inner one of said concentrically disposed TEM mode transmission lines being adjustably short-circuited at a position from said reactance device to provide a reactance to resonate at said third frequency with the fixed reactance of said device, first and second electromagnetic wave filtering means respectively positioned in the inner one of said concentrically disposed transmission lines and in said first TEM mode transmission line at respective given distances from said reactance device, said filtering means functioning to pass electromagnetic waves at said third frequency but blocking electromagnetic waves at said first and second frequencies, the outer one of said concentrically disposed TEM mode transmission lines being adjustably short-circuited to provide at said second frequency a variable reactance in series with the portions of said first and inner concentric TEM mode transmission lines bounded by said two filtering means, said portions of the first and inner concentric TEM mode transmission lines bounded by said two filtering means and including said adjustable-length outer concentric TEM mode transmission line providing a circuit that resonates at said second frequency with the fixed reactance of said non-linear variable reactance device, said outer concentric TEM mode transmission line having a length that is a negligible distance compared to a wavelength at said third frequency, thereby having a substantially negligible effect on electromagnetic waves at said third frequency.

4. A tunable broadband non-degenerate parametric amplifier comprising the combination, a section of uniconductor rectangular waveguide adapted to support electromagnetic waves at first and second frequencies and being cutoff to electromagnetic waves at a third frequency, one end of said rectangular waveguide being adapted to receive electromagnetic waves at said first frequency, first and second sections of coaxial transmission lines extending transversely from opposite broad walls of said rectangular waveguide at a region intermediate its two ends, non-linear variable reactance means positioned within said rectangular waveguide and electrically connected between the inner conductors of said coaxial lines, said reactance means being characterized by having a fixed component of reactance and a non-linear variable component of reactance at a given frequency, means at the opposite end of said rectangular waveguide for providing a reactive termination to electromagnetic waves at said first and second frequencies, said waveguide terminating means providing a reactance to resonate at said second frequency with the fixed reactance of said variable reactance device, means for coupling electromagnetic waves at a third frequency to the opposite end of said first coaxial transmission line, means for providing a reactive termination at the opposite end of said second coaxial transmission line to provide a reactance to resonate at said third frequency with the fixed reactance of said variable device, a third coaxial transmission line disposed concentrically about said second coaxial transmission line and having one end in electromagnetic wave coupling relationship with said second coaxial transmission line, first and second electromagnetic wave filter means respectively positioned in said first and second coaxial transmission lines at given distances from the respective broad walls of the rectangular waveguide and having reactances to pass only electromagnetic waves at said third frequency, and means for providing a reactive termination in said third coaxial transmission line, whereby said third coaxial transmission line presents a reactance that is serially connected with said second coaxial transmission line, said filtering means providing respective terminating reactances and said third coaxial transmission providing a series reactance all of which are proportioned to provide a circuit to resonate at said second frequency with the fixed reactance of said variable reactance means, said third coaxial transmission line having a length that is a negligible distance compared to a wavelength at said third frequency, thereby having a substantially negligible effect on electromagnetic waves at said third frequency.

5. A tunable broadband non-degenerate parametric amplifier comprising, a section of rectangular uniconductor waveguide, non-linear variable reactance means disposed within said uniconductor waveguide intermediate its two ends, said variable reactance device having two terminals and being characterized by having a component of fixed reactance and a component of non-linear variable reactance, first and second coaxial waveguides coupled to respective terminals of said variable reactance device through opposite broad walls of said uniconductor waveguide, means for coupling electromagnetic waves at a pump frequency into one end of said uniconductor waveguide, means for coupling electromagnetic waves at a signal frequency into one end of the first one of said coaxial waveguides, first and second frequency filtering means respectively disposed in said first and second coaxial waveguides intermediate their ends for passing signal frequency waves but not pump frequency or idler frequency waves, a third coaxial waveguide disposed concentrically around the second one of said coaxial waveguides and being in electromagnetic wave coupling relationship with said uniconductor waveguide through a broad wall thereof, first, second, and third adjustable short circuiting terminating means respectively terminating said uniconductor waveguide, the second one of said coaxial waveguides, and said concentrically disposed coaxial waveguide, the first one of said short circuiting terminating means being adapted to provide a reactance to resonate with the fixed reactance of said variable reactance device at the idler frequency that differs from said pump frequency by the signal frequency, the second short circuiting terminating means being adapted to provide a reactance to resonate with the fixed reactance of said variable reactance device at said signal frequency, the adjacent portions of said first and second coaxial waveguides bounded by said filtering means and said concentrically disposed coaxial waveguide and said variable reactance device defining a circuit that is tunable by means of the adjustable terminating means of said concentrically disposed coaxial waveguide so as to resonate with the fixed reactance of the variable reactance device at said idler frequency, said concentrically disposed coaxial waveguide having a length that is a negligible distance compared to a wavelength at said signal frequency.

References Cited by the Examiner

Matthaei: "IRE Transactions on Microwave Theory and Techniques," January 1961, pages 23–38.

Gilden et al.: "IRE Transaction on Microwave Theory and Techniques," November 1961, pages 484–490.

Vincent et al.: "1962 International Solid-State Circuits Conference," pages 20–21.

ROY LAKE, *Primary Examiner.*